United States Patent [19]

Saeki et al.

[11] Patent Number: 5,070,701
[45] Date of Patent: Dec. 10, 1991

[54] COOLING APPARATUS

[75] Inventors: Hiroshi Saeki, Tsukuba; Junji Ikeda, Ikoma; Hajime Ishimaru, Tsukuba-shi, Ibaraki-ken, all of Japan

[73] Assignees: Matsushita Electric Industrial Co., Ltd., Osaka; Hajime Ishimaru, Ibaraki, both of Japan

[21] Appl. No.: 387,969

[22] Filed: Aug. 1, 1989

[30] Foreign Application Priority Data

Aug. 1, 1988 [JP] Japan .................... 63-192536

[51] Int. Cl.⁵ .................................... F25B 21/00
[52] U.S. Cl. .............................. 62/3.1; 62/3.6
[58] Field of Search ....................... 62/3.1, 3.6

[56] References Cited

U.S. PATENT DOCUMENTS

| | | | |
|---|---|---|---|
| 2,994,203 | 8/1961 | Lackey et al. | 62/3 |
| 3,040,539 | 6/1962 | Gaugler | 62/3.6 |
| 3,097,027 | 7/1963 | Mims et al. | 308/189 |
| 3,127,749 | 4/1964 | Bergvail et al. | 62/3 |
| 3,232,063 | 2/1966 | Eichhorn et al. | 62/3.6 |
| 3,276,914 | 10/1966 | Shoupp | 136/202 |
| 3,648,470 | 3/1972 | Schultz | 62/3 |
| 3,823,567 | 7/1974 | Corini | 62/3.6 |
| 3,973,938 | 8/1976 | Szabo et al. | 62/3.6 |
| 4,593,529 | 6/1986 | Birochik | 62/3.6 X |

FOREIGN PATENT DOCUMENTS

| | | |
|---|---|---|
| 0271704 | 6/1988 | European Pat. Off. |
| 3003112 | 8/1981 | Fed. Rep. of Germany |
| 700013 | 2/1931 | France |
| 1205465 | 2/1960 | France |
| 2274142 | 1/1976 | France |
| 832422 | 4/1960 | United Kingdom |

Primary Examiner—Lloyd L. King
Attorney, Agent, or Firm—Wenderoth, Lind & Ponack

[57] ABSTRACT

An apparatus for cooling various types of heating sources in vacuum, wherein the heating source is adapted to be electronically cooled by the cooling portion thereof with the Pelter effect disposed in the vacuum by the feeding of the current from a DC power supply into a circuit formed by the use of the thermo-electric materials, resulting in that the response speed of the cooling may be improved, and the pollution within the vacuum portion may be prevented.

17 Claims, 5 Drawing Sheets

Fig. 5 - PRIOR ART

COOLING APPARATUS

BACKGROUND OF THE INVENTION

The present invention relates to an apparatus for cooling various types of heating sources in a vacuum such as cooling a wafer in a manufacturing process within a vacuum apparatus, cooling a motor for vacuum use, cooling other heating sources, cooling a shroud for a floating molecule trap, cooling a calculation circuit enclosed in a vacuum, and so on.

Conventionally, in, for example, a vacuum apparatus, a water-cooled pipe, a heat pipe or the like is normally used to cool a wafer used in a manufacturing process or a vacuum motor. Also, the calculation circuits of the conventional large-size computers are cooled with the use of liquid nitrogen without the enclosing thereof in a vacuum. The cooling apparatus in a conventional vacuum apparatus will be described with reference to FIG. 5.

As shown in FIG. 5, a vacuum bulkhead 103 is mounted on the flange 102 of a chamber 101 with bolts, nuts (not shown), and an O ring 104 is interposed in its compressed condition between the flange 102 and the vacuum bulkhead 103, so as to seal the joint between them. The water cooling pipes 105, 106 are extended in an air tight condition into the vacuum bulkhead 103. On the other hand, a cooling block 107 having a cooling room is mounted on a vacuum motor (not shown) which is a heating source within the chamber 101. Flexible water cooling pipes 108, 109 are communicated with both side portions of the cooling block 107, and the respective flexible water cooling pipes 108, 109 have bellows 108a, 109a provided in their middle portions. The water cooling pipes 105, 106 and the flexible water-cooling pipes 108, 109 are respectively coupled within the chamber 101 by connectors 110, 111, with a sealing material (not shown) being interposed between the end faces of the water cooling pipes 105, 106 and the flexible water cooling pipes 108, 109.

The cooling water is circulated into the water cooling pipe 105, the flexible water cooling pipe 108, the cooling block 107, the flexible water cooling pipe 109, and the water cooling pipe 106, so as to cool the heating source through the cooling block 107.

However, with the construction of the conventional embodiment, the response speed of the cooling operation is poor and the connecting operation of the connectors 110, 111 is inconvenient. Also, when the heating source and the vacuum motor are movable, it is necessary to use the flexible water cooling pipes 108, 109, but cracks are caused in the bellows 108a, 109a by the stress, thermal influences in the manufacturing process for the wafer or the like, and also leakage is likely to be caused in the sealing material of the water cooling pipes 105, 106 and the flexible water cooling pipes 108, 109. When the water is leaked from the cracked portions or the connectors 110, 111, it pollutes the interior of the vacuum apparatus which may result in failure thereof. Also, when the calculation circuit of the large-size computer is cooled with the liquid nitrogen, the consumption amount of the liquid nitrogen increases and the scale of the facilities become large, so that smaller sizes cannot be obtained and costs become higher.

SUMMARY OF THE INVENTION

Accordingly, an essential object of the present invention is to be provide a cooling apparatus which is capable of improving the response speed of the cooling operation, reducing the cost, and preventing pollution in the vacuum.

Also, another object of the present invention is to provide a cooling apparatus which is capable of easily effecting the connecting operation with the heating source.

In accomplishing these and other objects, according to one preferred embodiment of the present invention, a circuit is formed by the use of a thermoelectric material, the thermoelectric material is extended through the vacuum bulkhead, the cooling portion and the heating portion cooled and heated, respectively, by the Peltier effect of the circuit are respectively disposed in the vacuum (i.e. in a vacuum chamber) and in the air (i.e. outside of the vacuum chamber), and the DC power supply is connected with the circuit in the air.

The thermoelectric material is formed linear and the linear thermoelectric material is covered with a metallic sheath. Also, it is preferable to have the thermoelectric material formed as a thin membrane on a base plate.

Also, a cooling means is provided on the heating portion.

The present invention has the following function in the above-described construction.

Current is fed by the DC power supply into the circuit formed by the use of the thermoelectric material, so that the heating source may be electronically cooled through use of the Peltier effect by the cooling portion disposed in the vacuum.

The thermoelectric material can be formed linear and the linear thermoelectric material is covered with a metallic sheath. Also, the thermoelectric material can be formed as a thin membrane on the base plate divided at a halfway point to as to connect the cooling portion with the heating source. Thereafter, the end of the thermoelectric material can be connected at or near the outer portion of the vacuum bulkhead, or the cooling portion may be connected with the heating source by use of flexible portions.

Also, although the efficiency of the cooling portion in cooling the heating source is improved as no convection current exist in the vacuum, the transferring of the heat of the heating portion to the cooling portion by the thermoelectric material may be controlled so as to further improve the cooling efficiency.

BRIEF DESCRIPTION OF THE DRAWINGS

These and other objects and features of the present invention will become apparent from the following description taken in conjunction with the preferred embodiment thereof with reference to the accompanying drawings, in which:

FIG. 5 is a partially cut-away side view of the essential portions of a conventional cooling apparatus.

DETAILED DESCRIPTION OF THE INVENTION

Figure 1:
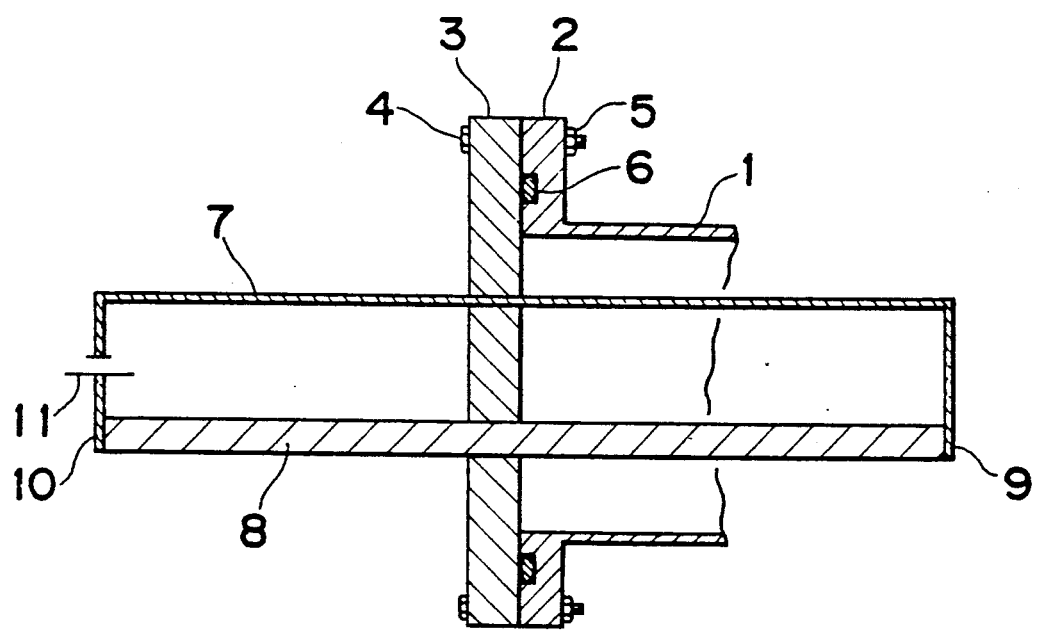
FIG. 1 is a sectional view of the essential portions for illustrating a principle showing a cooling apparatus in a first embodiment of the present invention.

Before the description of the present invention proceeds, it is to be noted that like parts are designated by like reference numerals throughout the accompanying drawings.

Referring now to the drawings, there is shown in FIG. 1, a sectional view of the essential portions for illustrating the principle of a cooling apparatus in a first embodiment of the present invention. The vacuum bulkhead 3 is mounted with bolts 4, nuts 5 on the flange 2 of a vacuum chamber 1 and an O-ring 6 interposed in a compressed condition between the flange 2 and the vacuum bulkhead 3 so as to seal the connection therebetween. The first and second thermoelectric materials 7, 8 are made of different kinds of materials such as Sb and Bi, respectively, with the end portions of the first and second thermoelectric materials 7 and 8 mutually connected to form a circuit. The first and second thermoelectric materials 7 and 8 are extended through the vacuum bulkhead 3, secured with an epoxide series bonding agent, and retained in an airtight condition. The cooling portion 9 and the heating portion 10 cooled and heated, respectively, by a Peltier effect are respectively disposed within the chamber 1 and in the air (i.e. outside of the chamber 1). The DC power supply 11 is inserted halfway along the heating portion 10 into the first thermoelectric material 7. And the cooling portion 9 is connected with the heating supply (not shown).

In the above-described construction, the operation thereof will be described hereinafter.

The current is fed into a circuit including the first and second thermoelectric materials 7, 8 by the DC power supply 11, and the cooling portion 9 is cooled by the Peltier effect so as to heat the heating portion 10. And the heating source may be electronically cooled by the cooling operation of the cooling portion 9. At this time, there is less convection current in the vacuum, so that the cooling efficiency of the heating source by the cooling portion 9 may be improved. Also, as the cooling operation is electronically effected as described hereinabove, the response speed of the cooling may be improved as compared with the water cooling system or the like used in conventional embodiments.

Figure 2A:
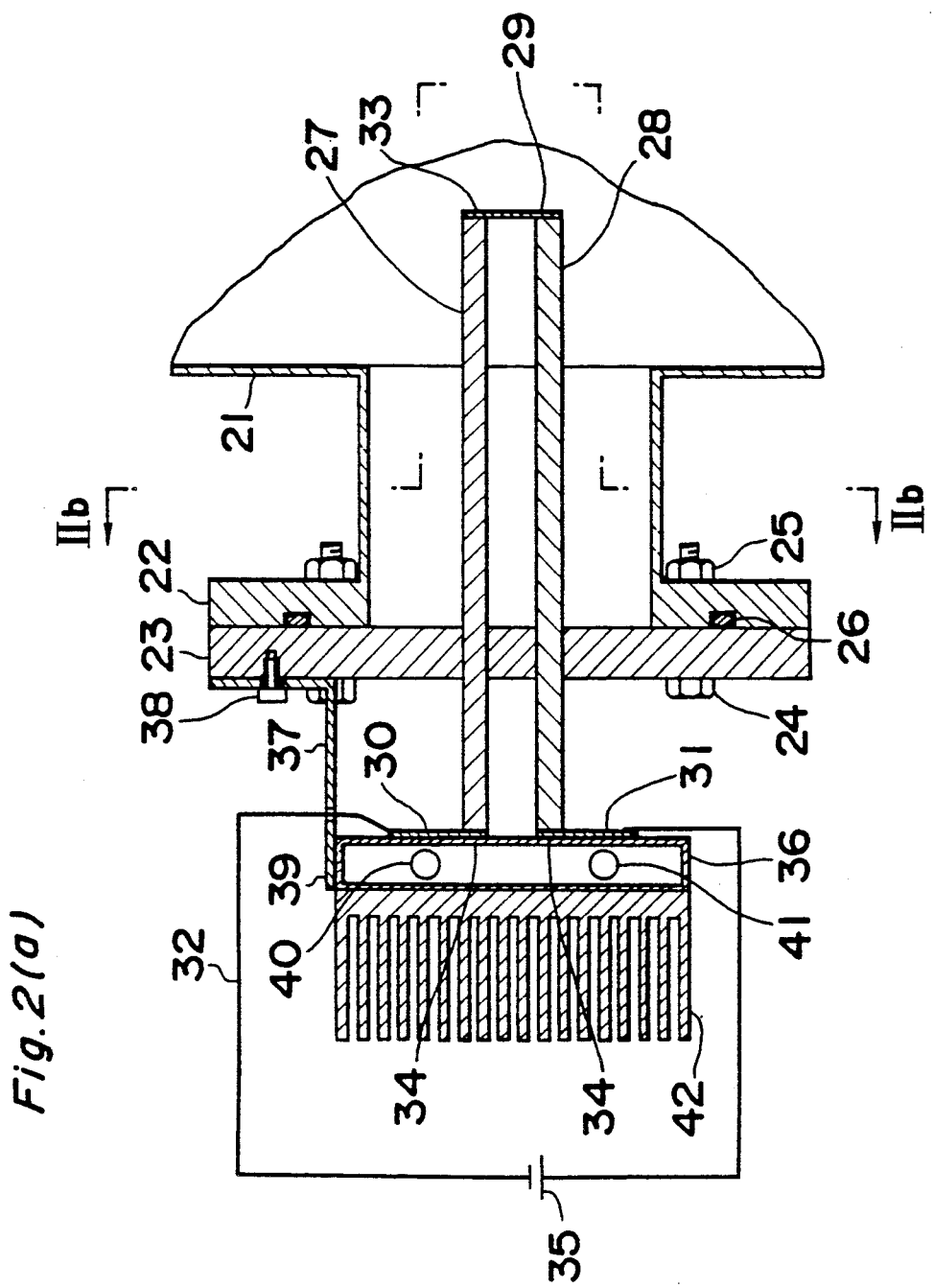
FIGS. 2(a) through (c) show a cooling apparatus in a second embodiment of the present invention, with FIG. 2(a) thereof being a sectional view of the essential portions, FIG. 2(b) thereof being a sectional view taken along a line IIb—IIb of FIG. 2(a) and, FIG. 2(c) thereof being a left side view of FIG. 2(a)
Figure 2B:
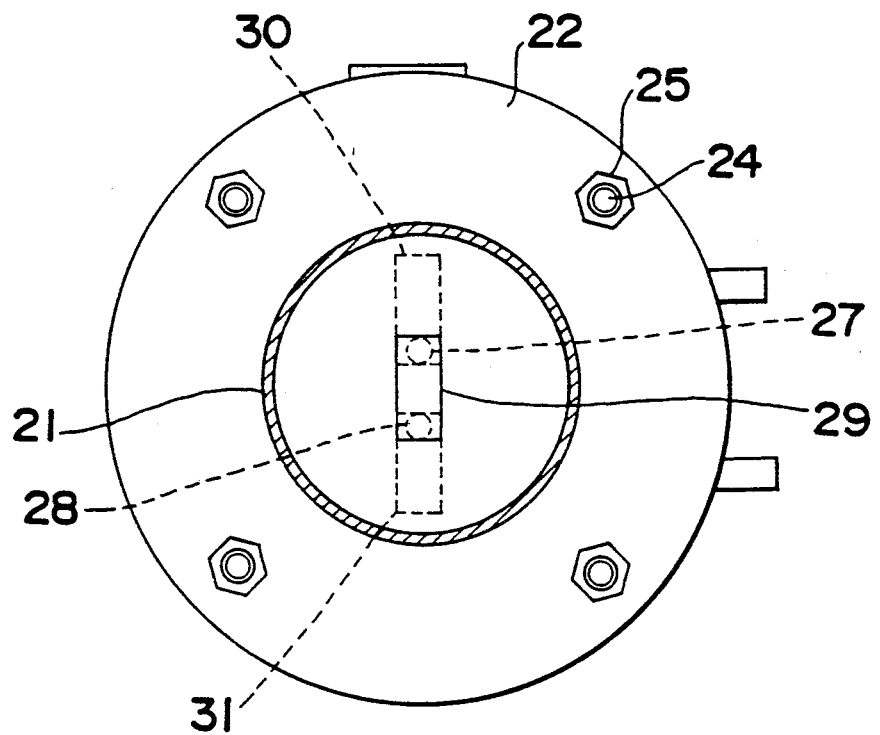
Figure 2C:
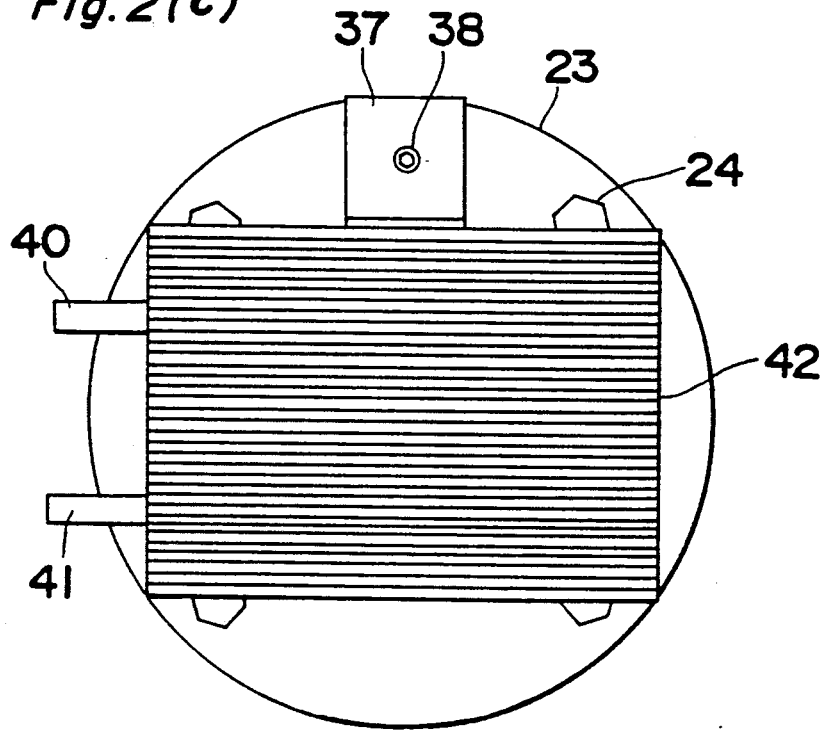

The second embodiment of the present invention will be described hereinafter. FIGS. 2(a) through (c) show the cooling apparatus in the second embodiment of the present invention. FIG. 2(a) shows the sectional view of the essential portions. FIG. 2(b) is a sectional view taken along line IIb—IIb of FIG. 2(a). FIG. 2(c) is a left side view of FIG. 2(a).

As shown in FIGS. 2(a) through (c),, the vacuum bulkhead 23 is mounted with bolts 24, nuts 25 on the flange 22 of the chamber 21 which becomes a vacuum, and an O-ring 26 is interposed in a compressed condition between the flange 22 and the vacuum bulkhead 23 so as to seal the connection therebetween. The first and second thermoelectric materials 27, 28 are formed as linear semiconductors of, for example, $Bi_2Te_3+Sb_2Te_3$, $Bi_2Te_3+Bi_2Se_3$, and are preferably covered with metallic sheaths. An electrode plate 29 made of Cu is spliced by solder of an In radical between adjacent end portions of the first and second thermoelectric materials 27, 28. Electrode plates 30, 31 made of Cu are spliced by solder of an In radical with the respective other ends of the first and second thermoelectric materials 27, 28, and a Cu connection or wire 32 is connected between the electrode plates 30, 31 to form a circuit. And the splicing portion between the first and second thermoelectric materials 27, 28 and the electrode plate 29 becomes a cooling portion 33 cooled by the Peltier effect, and the splicing portion between the first and second thermoelectric materials 27, 28 and the electrode plates 30, 31 is set to become a heating portion 34. The first and second thermoelectric materials 27, 28 are extended through the vacuum bulkhead 23, are secured with an epoxide series bonding agent, and are retained in an air tight condition, so that the cooling portion 33 and the heating portion 34 are respectively disposed within the chamber 21 and in the air. A DC power supply 35 is inserted halfway along the CU wire 32 extending from the electrode plates 30, 31 constituting the heating portion 34. A cooling block 36 for cooling these heating portions 34, 34 is connected between the heating portions 34, 34. Namely, one side of a stay 37 is mounted on one side of the cooling block 36, the other side of the stay 37 is mounted on the vacuum bulkhead 23 by the bolt 38. The cooling block 36 is supported with respect to the vacuum bulkhead 23 and is retained in contact condition with the heating portions 34, 34. The cooling block 36 has a cooling chamber 39 therein which communicates with one end of each of the circulating pipes 40, 41 for the cooling medium. The other ends of the respective circulating pipes 40, 41 are communicated with a pump (not shown). Air cooling fins 42 are mounted on the outer face of the cooling block 36. And the cooling portion 33 is connected with the heating source (not shown).

The operation of the above-described construction will be described hereinafter.

When a current is fed into a circuit using the first and second thermoelectric materials 27, 28 by the DC current supply 35, the cooling portion 33 is cooled by the Peltier effect, and the heating portion 34 is heated. And the heating source may be electronically cooled by the cooling of the cooling portion 33. At this time, as there are no convection currents in the vacuum, the cooling efficiency of the heating source may be improved by the cooling portion 33. On one hand, the cooling water is circulated through the circulating pipe 40, the cooling chamber 39 of the cooling block 36, and the circulating pipe 41 by the driving operation of the pump so as to cool the heating portion together with air cooling fins 42 of the cooling block 36. In this manner, the transferring of the heat of the heating portion 34 into the cooling portion 33 by the first and second thermoelectric materials 27, 28 may be reduced so as to further improve the cooling efficiency. Also, the electronic cooling operation is effected as described hereinabove, the response speed of the cooling operation may be improved as compared with the conventional water cooling system or the like. Also, the first and second thermoelectric materials 27, 28 are made linear as described hereinabove, and are covered with sheaths and divided at a halfway point so as to connect the cooling portion 33 with the heating source. Thereafter, the ends may be connected at or near the outer portion of the vacuum bulkhead 23. Or the cooling portion 33 may be connected with the heating source by flexible portions thereof, such that the connecting operation may be easily carried out.

Figure 3A:
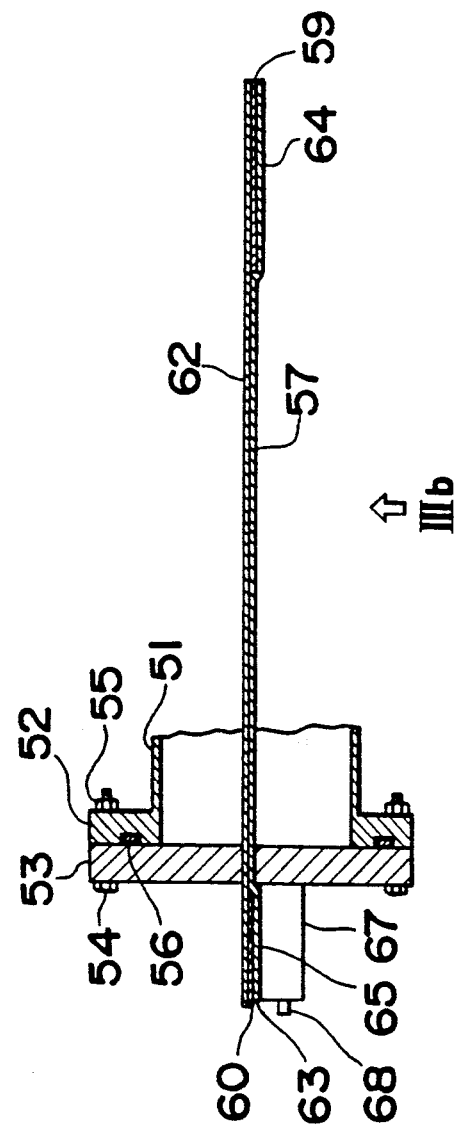
FIGS. 3(a) and 3(b) show a cooling apparatus in a third embodiment of the present invention, with FIG. 3(a) thereof being a sectional view of the essential portions, and FIG. 3(b) thereof being a sectional view taken along line IIIb—IIIb of FIG. 3(a)
Figure 3B:
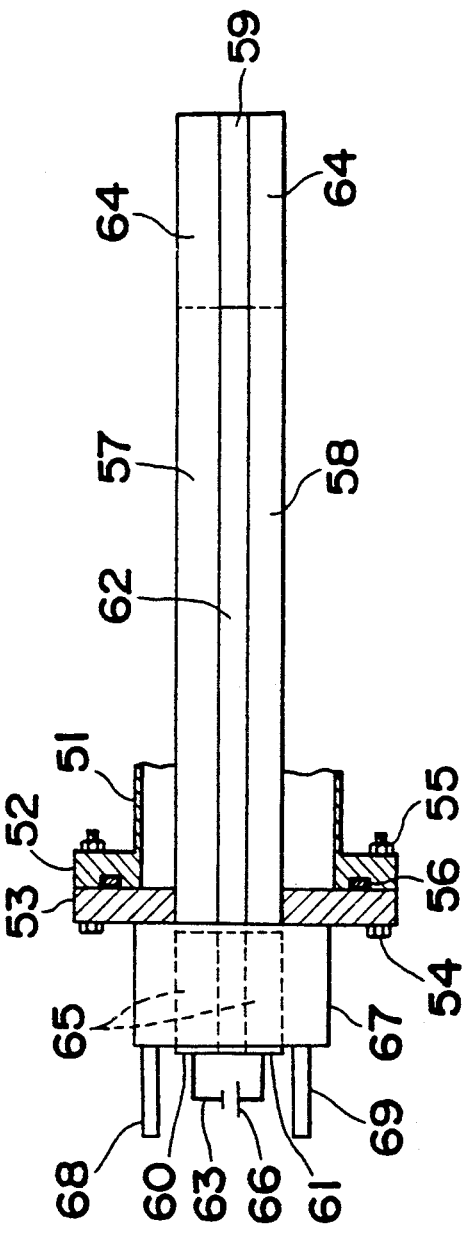

The third embodiment of the present invention will be described hereinafter. FIGS. 3(a) and 3(b) show the cooling apparatus in the third embodiment of the present invention, with FIG. 3(a) thereof being the sectional view of the essential portions, and FIG. 3(b) thereof being a view as seen from a direction III of FIG. 3(a).

As shown in FIGS. 3(a) and 3(b), the vacuum bulkhead 53 is mounted with bolts 54 and nuts 55 on the flange 52 of the chamber 51 which becomes a vacuum, and an O-ring 56 is interposed in a compression condition between the flange 52 and the vacuum bulkhead 53 so as to seal the connection therebetween. The first and second thermoelectric materials 57, 58 are formed as thin membranes together with the electrodes 59, 60, 61 on the thin base plate 62 of, for example, $Bi_2Te_3+Sb_2Te_3$, $Bi_2Te_3+Bi_2Se_3$. Namely, the electrode 59 is provided by vacuum evaporation or the like on one side end portion of the base plate 62 made of the epoxide resin, glass or the like, and a pair of electrodes 60, 61 are respectively provided along the long side on the other side end portion by vacuum evaporation or the like. The first and second thermoelectric materials 57, 58 are provided by vacuum evaporation or the like along the long side of the base plate 62 and the electrodes 59, 60, 61. Preferably the base plate 62 is made of a deformable material, and the first and second thermoelectric materials 57, 58 and the base plate 62 are composed of a freely deformable material. The Cu wire 63 extends from the electrodes 60, 61 to form a circuit. And the splicing portion between the first and second thermoelectric materials 57, 58 and the electrode 59 becomes a cooling portion 64. The splicing portions between the first and second thermoelectric materials 57, 58 and the electrode plates 60, 61 are set to become the heating portion 65. The first and second thermoelectric materials 57, 58 are extended through the vacuum bulkhead 53 and are secured with the epoxide series bonding agent, and also, are retained in the airtight condition, so that the cooling portion 64 and the heating portion 65 are respectively disposed within the chamber 51 and in the air. A DC power supply 66 is inserted halfway along the Cu wire 63 which extends from the electrode plates 60, 61 constituting the heating portion 65. The cooling block 67 for cooling the heating portions 65, 65 is connected between the heating portions 65, 65. The cooling block 67 has a cooling chamber therein as in the second embodiment, with adjacent ends of the circulating pipes 68, 69 being communicated with the cooling chamber, the other ends of the respective circulating pipes 68, 69 being communicated with a pump (not shown). And the cooling portion 64 is connected with a heating source (not shown).

The operation of the above-described construction will be described hereinafter.

When the current is fed into the circuit using the first and second thermoelectric materials 57, 58 by the DC power supply 66, the cooling portion 64 is cooled by the Peltier effect, the heating portion 65 is heated, and the heating source may be electronically cooled by the cooling operation of the cooling portion 64. At this time, as there are no convection currents in the vacuum, the cooling efficiency of the heating source by the cooling portion 64 may be improved. On the other hand, the cooling fluid may be circulated through the circulating pipe 68, the cooling chamber of the cooling block 67, and the circulating pipe 69 by the driving operation of the pump so as to cool the heating portion 65 by the cooling block 67. In this manner, the transferring of the heat of the heating portion 65 into the cooling portion 64 by the first and second thermoelectric materials 57, 58 may be controlled, thus further improving the cooling efficiency. Also, as the cooling operation is electronically effected as described hereinabove, the response speed of the cooling operation may be improved as compared with the conventional water cooling system or the like. Also, as described hereinabove, the first and second thermoelectric materials 57, 58 are provide as a thin membrane on the base plate 62 divided at a halfway point. The cooling portion 64 may be readily connected with the heating source even at or near the outer portion of the vacuum bulkhead 53 or the cooling portion 64 of which the elements are formed due to the flexible nature of the deformable materials.

It is to be noted that even in the present embodiment, the cooling block 67 combined together with air cooling fins may be used as in the second embodiment.

Figure 4:
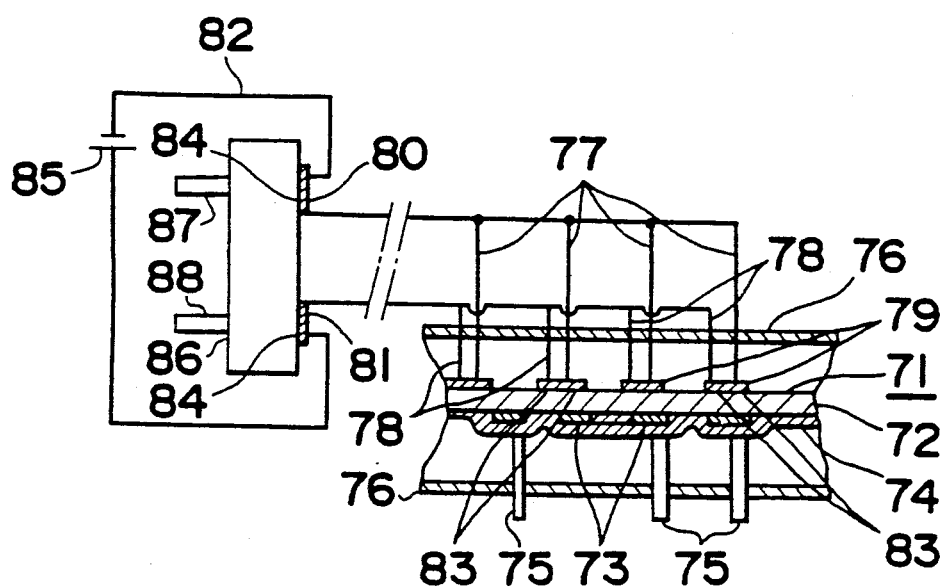
FIG. 4 is a sectional view of the essential portions of a cooling apparatus in a fourth embodiment of the present invention.
Figure 4:
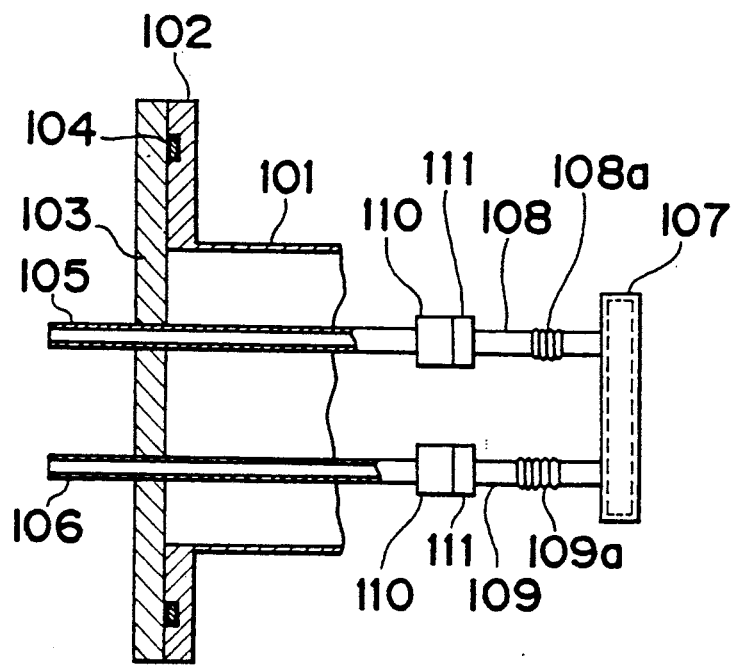

The fourth embodiment of the present invention will be described hereinafter. FIG. 4 is a sectional view of the essential portions of the cooling apparatus in the fourth embodiment.

In the present embodiment, the cooling operation of the calculating portion of a large-size computer is effected, the calculation circuit 71 has a circuit pattern 73 disposed on an insulating base plate 72 as shown in FIG. 4, with the circuit pattern 73 being covered with an insulating membrane 73. A terminal 75 is connected with the circuit pattern 73. The calculation circuit 71 is enclosed in a vacuum condition within the vacuum bulkhead 76, with the terminal 75 being inserted so as to retain an air tight condition in the vacuum bulkhead 76. A lot of first and second thermoelectric materials 77 and 78 are formed of linear semiconductors of, for example, $Bi_2Te_3+Sb_2Te_3$, $Bi_2Te_3+Bi_2Se_3$. Electrode plates 79 made of Cu are soldered between adjacent ends of the first and second thermoelectric materials 77, 78, and the electrode plates 80, 81 made of Cu are soldered onto the respective other ends of the first and second thermoelectric materials 77, 78, so that the Cu wire 82 extends from the electrode plates 80, 81 to form the circuit. The splicing portions between the first and second thermoelectric materials 77, 78 and the electrode plates 79 become cooling portions 83 cooled by the Peltier effect, and the splicing portion between the first and second thermoelectric materials 77, 78 and the electrode plates 80, 81 are set to become a heating portion 84. The first and second thermoelectric materials 77, 78 are extended through the vacuum bulkhead 76, retaining the air tight condition. The electrodes 79 forming the cooling portions 83 are connected with the heating portion in the insulating base plate 72, with the heating portion 84 being disposed in the air. The DC power supply 85 is inserted halfway along the Cu wire 82 extending from the electrode plates 80, 81 composing the heating portion 84. A cooling block 86 for cooling these heating portions 84, 84 is connected between the heating portions 84, 84. The cooling block 86 has a cooling chamber therein with the adjacent end portions of the circulating pipes 87, 88 communicated with the cooling chamber and the other ends of the respective circulating pipes 87, 88 being communicated with a pump (not shown).

The operation of the above-described construction will be described hereinafter.

When a current is fed into a circuit using the first and second thermoelectric materials 77, 78 by the DC power supply 85, the cooling portion 83 is cooled by the Peltier effect to heat the heating portion 84. The heating portion of the calculation circuit 71 may be electronically cooled by the cooling operation of the cooling portion 83. At this time, there are no convection currents, so that the cooling efficiency of the heating portion by the cooling portion 83 may be improved. On the other hand, the cooling water is circulated through the circulating pipe 87, the cooling block 86, and the circulating pipe 88 by the driving operation of the pump. In this manner, the heating portion 84 may be cooled by the cooling lock 86 to reduce the transferring of the heat of the heating portion 84 into the cooling portion 83 by the first and second thermoelectric materials 77, 78, thus further improving the cooling efficiency. Also, as the cooling operation is electronically effected as described hereinabove, the response speed of the cooling operation may be improved as compared with the conventional water-cooling system or the like. Also, the first and second thermoelectric materials 77, 78 are formed linear as described hereinabove and divided at a halfway point. After one cooling portion 83 has been connected with the heating portion of the calculation circuit 71, the connection may be effected with respect to each other at the outer portion of the vacuum bulkhead 76, the cooling portion 83 may be connected easily with the heating portion of the calculation circuit 71.

It is to be noted that air cooling fins combined with the cooling block 86 may be used as in the second embodiment.

In the second, third and fourth embodiments, for example, liquid nitrogen, instead of cooling water, may be circulated in the circulating pipes 50, 51, 68, 69, 87, 88 and the cooling blocks 36, 67, 86. By the use of the liquid nitrogen, the cooling operation may be effected at the same temperature as that when the heating source is cooled with the use of liquid helium.

As described hereinabove, according to the present invention, as the heating source is adapted to be electronically cooled by the Peltier effect of the cooling portion disposed in the vacuum by feeding current from the DC power supply into a circuit formed by the thermoelectric materials, the response speed for the cooling may be improved. Also the construction is simplified and the cost may be lowered. Also, as there is no possibility of water leakage or the like as shown before, pollution within the vacuum portion may be prevented.

Also, the thermoelectric material is formed linear, with the linear thermoelectric materials being covered with metallic and the thermoelectric materials being provided in a thin membrane shape on the base plate. They are divided at a halfway point thereof so as to connect the cooling portion side with the heating portion. Thereafter, the connection is effected with respect to each other at or near the outer portion of the vacuum bulkhead. Also, the cooling portion may be connected with the heating source by the use of flexible portions so that the cooling portion may be easily connected with the heating source.

Also, as there are convection currents in the vacuum, the cooling efficiency of the heating source is improved by the cooling portion. The heating portion of the circuit is cooled by the cooling means, so that the transferring operation of the heat of the heating portion into the cooling portion by the thermoelectric material may be reduced, with the cooling efficiency being further improved and the incidental facilities being reduced.

Although the present invention has been fully described by way of example with reference to the accompanying drawings, it is to be noted here that various changes and modifications will be apparent to those skilled in the art. Therefore, unless such changes and modification depart from the scope of the present invention, they should be construed as included therein.

What is claimed is:

1. A cooling apparatus comprising:
 a chamber wall (53) at least partially defining a chamber (51);
 a thin base plate (62) having first and second opposing ends, two opposing faces, and two opposing sides, and extending through said chamber wall from a position within said chamber to a position outside of said chamber;
 a first element (57), having first and second opposing ends, formed of a first thermoelectric material affixed on one of said faces of said base plate and extending from said first end to said second end of said base plate, such that said first element extends through said chamber wall from a position within said chamber to a position outside of said chamber;
 a second element (58), having first and second opposing ends, formed of a second thermoelectric material, different than said first thermoelectric material, affixed on said one of said faces of said base plate, extending from said first end to said second end of said base plate, such that said second element extends through said chamber wall from a position within said chamber to a position outside of said chamber, said second element being spaced apart from said first element, said first end of said first element being electrically connected to said first end of said second element, and said second end of said first element being electrically connected to said second end of said second element, so as to form an electrical circuit (57, 58, 59, 60, 61, 63); and
 power supply means (66) for supplying electrical power to said electrical circuit formed by said first and second elements so as to cause cooling of said chamber due to a Peltier effect.

2. A cooling apparatus as recited in claim 1, wherein said chamber comprises a vacuum chamber.

3. A cooling apparatus as recited in claim 1, wherein said power supply means comprises a DC power supply.

4. A cooling apparatus as recited in claim 1, wherein said power supply means is connected into said electrical circuit at a position outside of said chamber.

5. A cooling apparatus as recited in claim 1, wherein said first and second thermoelectric materials are semi-conductors.

6. A cooling apparatus as recited in claim 1, wherein said first thermoelectric material comprises $Bi_2Te_3 + Sb_2Te_3$, and said second thermoelectric material comprises $Bi_2Te_3 + Bi_2Se_3$.

7. A cooling apparatus as recited in claim 1, wherein said first and second elements are linear.

8. A cooling apparatus as recited in claim 1, wherein said first and second elements are formed as thin membranes on said base plate.

9. A cooling apparatus as recited in claim 1, wherein a portion of said electrical circuit located outside of said chamber defines a heating portion (65), a portion of said electrical circuit located inside said chamber defines a cooling portion (64); and a cooling means (67, 68, 69) is provided for cooling said heating portion.

10. A cooling apparatus as recited in claim 9, wherein said cooling means comprises a cooling block (67) within which is defined a cooling room, and a cooling medium circulating pipe in (68, 69) communication with said cooling room.

11. A cooling apparatus as recited in claim 9, further comprising
an electrode (59) mounted to said base plate and electrically connecting said first end of said first element to said first end of said second element.

12. A cooling apparatus as recited in claim 11, wherein
said electrode is affixed directly to said one of said faces of said base plate at said first end thereof; and
said first and second elements are affixed against said electrode.

13. A cooling apparatus as recited in claim 12, wherein
said first element extends along one of said two opposing sides of said base plate, and said second element extends along the other of said two opposing sides of said base plate.

14. A cooling apparatus as recited in claim 13, further comprising
a pair of additional electrodes (60, 61) mounted to said base plate in electrical contact with said first and second elements, respectively; and
means (63) for electrically connecting each of said additional electrodes to said power supply means.

15. A cooling apparatus as recited in claim 14, wherein
each of said additional electrodes is affixed directly to said one of said faces of said base plate at said second end thereof; and
said first and second elements are affixed against said additional electrodes, respectively.

16. A cooling apparatus as recited in claim 1, further comprising
a pair of electrodes (60, 61) mounted to said base plate in electrical contact with said first and second elements, respectively; and
means (63) for electrically connecting each of said electrodes to said power supply means.

17. A cooling apparatus as recited in claim 16, wherein
each of said electrodes is affixed directly to said one of said faces of said base plate at said second end thereof; and
said first and second elements are affixed against said electrodes, respectively.

* * * * *